United States Patent [19]
Hu et al.

[11] Patent Number: 5,546,340
[45] Date of Patent: Aug. 13, 1996

[54] NON-VOLATILE MEMORY ARRAY WITH OVER-ERASE CORRECTION

[75] Inventors: Chung-You Hu; Robert B. Richart; Shyam G. Garg; Sanjay K. Banerjee, all of Austin, Tex.

[73] Assignee: Advanced Micro Devices, Inc., Sunnyvale, Calif.

[21] Appl. No.: 487,252

[22] Filed: Jun. 13, 1995

[51] Int. Cl.$^6$ .................................................. G11C 7/00
[52] U.S. Cl. ................... 365/185.3; 365/185.29; 365/218
[58] Field of Search .................. 365/185.27, 185.29, 365/185.3, 185.31, 185.32, 185.33, 218

[56] References Cited

U.S. PATENT DOCUMENTS

| | | | |
|---|---|---|---|
| 4,958,321 | 9/1990 | Chang | 365/185 |
| 5,077,691 | 12/1991 | Haddad et al. | 365/218 |
| 5,237,535 | 8/1993 | Mielke et al. | 365/185.3 |
| 5,241,507 | 8/1993 | Fong | 365/185.33 |
| 5,272,669 | 12/1993 | Samachisa et al. | 365/185.3 |
| 5,295,107 | 3/1994 | Okazawa et al. | 365/185.3 |
| 5,335,198 | 8/1994 | Van Buskirk et al. | 365/218 |
| 5,424,993 | 6/1995 | Lee et al. | 365/218 |

OTHER PUBLICATIONS

S. Lai et al., "Comparison and Trends in Today's Dominant E$^2$ Technologies", *Int'l Electron Devices Meeting Tech. Digest*, (1986), pp. 580–583.

*Primary Examiner*—David C. Nelms
*Assistant Examiner*—Son Dinh
*Attorney, Agent, or Firm*—Conley, Rose & Tayon, P.C.

[57] ABSTRACT

A non-volatile memory device is provided having various electrical couplings for maximizing over-erased correction of that device. Over-erased devices within an array can be corrected in bulk, simultaneous with all other devices within the array. Bulk correction of an array of over-erased device is carried forth in a convergence technique which utilizes higher floating gate injection currents. Negatively biased substrate causes an enhancement in the injection current and resulting correction capability of the convergence operation. Moreover, convergence can be carried out with a lesser positive voltage upon the drain region, which implies a reduction in the source-to-drain currents as well as substrate currents during the convergence operation. Accordingly, only over-erased transistors receive sufficient turn-on during convergence, while all other transistors remain off. An array of over-erased and normal transistors undergoing the present convergence operation can be simultaneously corrected with a lessened concern with power consumption.

23 Claims, 4 Drawing Sheets

NON-VOLATILE MEMORY ARRAY WITH OVER-ERASE CORRECTION

BACKGROUND OF THE INVENTION

1. Field of the Invention

This invention relates to integrated circuits and more particularly to a structure and method for correcting, in parallel, one or more over-erased bits within a non-volatile memory array.

2. Description of the Relevant Art

There are many types of non-volatile memory, often called read only memory (ROM) or programmable read only memory (PROM). Non-volatile memory can be formed in either bipolar or MOS technology. Most MOS PROMs are based on one of three currently available technologies (i.e., EPROM, EEPROM or flash EPROM). Non-volatile MOS EPROMs are designed to perform in numerous similar ways, and can be achieved using many well-known technologies such as: (i) floating gate tunnel oxide, (ii) textured poly, (iii) metal nitride oxide silicon (MNOS), and (iv) EPROM-tunnel oxide (ETOX). Regardless of the form chosen, it is generally recognized that stacked polysilicon conductors are used to perform the program and erase functions. A comparison of the various non-volatile PROMs technologies is described in an article to S. Lai, et al., "Comparison and Trends in Today's Dominant $E^2$ Technologies", *Int'l Electron Devices Meeting Tech. Digest*, (1986) pp. 580–583 (herein incorporated by reference).

A conventional MOS PROM memory array of flash variety generally uses a single transistor for each cell within the array. The transistor is configured from a p-type substrate, having n-type source and drain regions provided within the substrate. In a flash EPROM device, the source is generally double-diffused. Thus, a double-diffused source region is defined to receive a n+ type dopant in the same source region in which a previous n− type dopant was placed. Between the source and drain regions is a channel region, over which a tunnel oxide is formed. Placed upon the tunnel oxide is a floating polysilicon gate, and insulatively spaced over the floating polysilicon gate is a control polysilicon gate. Control polysilicon gates (control gates) are connected to respective word lines within the MOS PROM memory array. Drain regions are connected to respective bit lines within the MOS PROM array.

Using a flash EPROM cell as an example, an MOS PROM cell is typically programmed by applying a relatively high voltage to the control gate and a moderately high voltage to the drain. Hot electrons are thereby injected as a result of the electric field created between the control gate and drain. The hot electrons are injected upon the floating gate and trapped in the floating gate due to the fact that the floating gate is surrounded by dielectrics. Thus, a program operation functions to place a net negative charge upon the floating gate. Any read from a cell having programmed charge on the floating gate requires a higher read voltage on the control gate than cells which are not programmed. Higher voltage upon the programmed cell control gate is necessary to activate or ("turn-on") the single transistor MOS PROM cell. Further stated, a programmed MOS PROM cell requires a higher turn-on voltage at the control gate or (word line) than that of a unprogrammed cell.

Again using a flash EEPROM cell as a example, a programmed non-volatile MOS PROM cell is erased by extracting electron charge from the floating gate. Erasure is accomplished by electron tunneling and/or hot-hole injection. Typically, a high voltage is applied to the source of the cell while the gate is grounded. The drain is usually floating, and electrons trapped upon the floating gate in a previous programming cycle are drawn (i.e., "tunneled") from the floating gate through the tunnel oxide and into the positively charged source.

The mechanism for programming and erasing a single transistor MOS PROM cell is described in reference to U.S. Pat. No. 4,958,321 (herein incorporated by reference). Described in U.S. Pat. No. '321 is the program and erase description of a flash EPROM cell. It is understood, however, that program and erase of an EEPROM or UV-erased EPROM is performed or can be performed in substantially the same manner. That is, program is achieved by injection of electrons onto the floating gate, and erase is achieved by electron tunneling and/or hot-hole injection of those programmed electrons from the floating gate. Described in U.S. Pat. No. 5,077,691 are a number of drawbacks associated with flash EEPROM erase operation. Mentioned in U.S. Pat. No. '691 is the problem of multiple power supply requirement and reverse voltage breakdown of the source during the erase operation. A double-diffused source region is typically employed to protect against the reverse voltage breakdown caused by the high positive voltage needed at the source during cell erase. U.S. Pat. No. '691 teaches an advantage of using a highly negative voltage upon the control gate and a moderately positive voltage at the source during the erase operation. A moderately positive voltage at the source is employed to circumvent the necessity of a double diffused source needed if the source were heavily biased positive.

While '691 teaches an improvement in the erase operation by utilizing a-negative voltage on the control gate, it does not suggest improvements in erase which might enhance the read operation. That is, after a cell has been repeatedly erased under conditions of Fowler-Norheim tunneling, it may eventually acquire a somewhat positive potential. Thus, over numerous erase cycles, the floating gate will assume a condition often referred to as "bit over-erase". A description of bit over-erase is provided in reference to U.S. Pat. No. 5,335,198 (herein incorporated by reference).

Bit over-erase generally presents problems during the read operation. An understanding of over-erase problem begins by an understanding of the read operation. Namely, the read operation employs positive voltage exceeding the "turn on" threshold upon a control gate to be read, while all other control gates not to be read and associated with a mutually-connected bit line receive voltage less than a threshold amount. A cell to be read thereby utilizes a ground potential at the source region while the control gate is held at a positive potential, e.g., +5.0 volts. The drain region is generally held at a lower positive potential, e.g., between +1.0 to +4.0 volts. Under these conditions, an unprogrammed cell will conduct current of a greater amount than that of a programmed cell. Thus, the programmed state of the array can be read using this selective read operation. In an over-erased condition, an erased cell (a cell which is "non-programmed") will take on a net positive voltage upon the floating gate. The positive voltage presents itself as a negative threshold voltage. Accordingly, an over-erased cell functions essentially as a depletion-mode transistor.

It is important that only the cell of interest be read, and that all other mutually connected cells not be read. Accordingly, only the programmed/unprogrammed state of the cell of interest need be read in a read cycle. The non-selected cells, or cells not of interest, are generally provided 0.0 volts upon the control gate in an attempt to ensure their inoperability. Unfortunately, if the non-selected cells are depletion-mode transistors (i.e., have negative threshold voltage brought about by an over-erase condition), then the over-erased cells will inadvertently be active causing leakage within the respective column bit line. Accordingly, an over-erased memory cell will disable an entire column of memory array. As used herein, the term "endurance" refers to the number of times a memory cell can be reprogrammed and erased with operability retained. If an over-erased condition causes inadvertent turn-on of a cell and inaccurate reading upon a column bit line, endurance of the corresponding memory cell is reduced. It is therefore important to maximize memory cell endurance by ensuring against inadvertent turn-on of over-erased cells without having to add complicated bit correction structures to the memory array. Conventional non-volatile memories employ bit correction circuitry which function to sense an over-erased cell and, as a result thereof, program back to a normal condition the over-erased memory cell. Sense and reprogram operations unduly adds complexity to the memory array and thereby reduces memory storage density.

SUMMARY OF THE INVENTION

The problems outlined above are in large part solved by a methodology for periodically correcting cells which have been over-erased. The present method is employed without requiring a bit correction structure added to the memory array. Bit correction can thereby be performed using circuitry which preexists for normal array operation, such as read, program and erase operations. Importantly, correction is performed upon an entire array in parallel. All memory cells which are over-erased within the array are corrected simultaneously using the "bulk" correction scheme hereof. The present methodology provides over-erase correction of each cell at a rate proportional to that cell's respective over-erased condition. More specifically, a cell which is more over-erased than another cell will experience correction at a faster rate than the lesser over-erased cell. The over-erased array of cells converges at a singular point in time for maximum efficiency.

Bulk correction of an entire array rather than one bit column at a time allows for faster convergence of the present correction scheme. Convergence time is shortened by biasing the substrate to a negative voltage. The electric field extending between the positively charged drain and the positively charged (over-erased) floating gate is believed to be controlled by the negatively charged substrate (or channel). Negative charge upon the substrate provides a relatively large injection current through the floating gate while utilizing a relatively small drain voltage. The drain voltage is thereby maintained at a smaller than normal voltage values without causing substantial reductions in floating gate injection current. A lessened drain voltage minimizes power consumption of the array during the over-erase correction period (i.e., during convergence) Minimizing drain voltage lessens reverse-biased current leakage from the drain to the substrate, and also minimizes source-to-drain currents of each transistor within the array. Minimizing power consumption by lowering drain voltage on each single-transistor cell allows more cells to be corrected simultaneously. Thus, bulk correction on an entire array, in parallel, can be achieved instead of the time consumptive, conventional column-by-column correction scheme.

Broadly speaking, the present invention contemplates a method for correcting an over-erase condition within a non-volatile memory array. The method comprises the steps of providing a non-volatile memory array having a plurality of single transistor memory cells. Each memory cell comprises a stacked pair of control and floating gates spaced above a channel region. The channel region is interposed between the source and drain region. A non-negative (i.e., a ground or positive) voltage is then applied to the control gate and the source region is grounded simultaneous with a negative voltage applied to the channel region and a positive voltage applied to the drain region. Application of specific voltages to the components of a single transistor memory cell cause movement of electrons from the substrate near the drain to the floating gate. An over-erased floating gate having positive charge is thereby neutralized by electrons sent along the electric field from the substrate near the drain to the floating gate. The amount of positive charge upon the floating gate regulates proportionally the amount of electrons flowing from the substrate near the drain to the floating gate. As such, floating gates which are heavily positive biased are corrected from their over-erased condition at a faster rate than floating gates which are lesser positive biased.

The present invention further contemplates a method for neutralizing positive charge upon a plurality of floating gates connected within a memory array. The method includes the steps of providing an array of transistors having a respective plurality of floating gates spaced from a single silicon substrate. The transistors are coupled between a common power supply and a plurality of bit lines. A positive voltage is simultaneously applied to each of the plurality of bit lines, a ground voltage is applied to the common power supply, a negative voltage is applied to the silicon substrate, and a second positive voltage from 0.0 to 3.0 volts is applied to the control gates. Application of specific voltages to various components of the device causes simultaneous neutralization of positive charge upon the plurality of floating gates.

The present invention still further contemplates a single transistor memory cell. The single transistor memory cell comprises a floating gate conductor dielectrically spaced above the silicon substrate into which a drain and source region are formed. A control gate is dielectrically spaced above the floating gate. An electric field is formed which extends in a curved path from the source to the floating gate upon application of positive voltage to the drain, negative voltage to the substrate, ground voltage to the source, and 0.0 to 3.0 volts to the control gate. Hot electrons are carried along the electric field for injection into the floating gate. The amount of hot electrons being injected into the floating gate is directly proportional to the amount of positive charge upon the floating gate.

The faster convergence of over-erase correction is achieved by the present method and structure using lower drain voltages. Implementing lower drain voltages than what is conventionally used, allows a larger number of over-erased transistors to be corrected in parallel. The present structure and methodology achieves correction of an over-erased condition upon each and every over-erased transistor within a memory array simultaneously, while performing the correction technique at a faster rate than conventional techniques.

BRIEF DESCRIPTION OF THE DRAWINGS

Other objects and advantages of the invention will become apparent upon reading the following detailed description and upon reference to the accompanying drawings in which.

Figure 1:
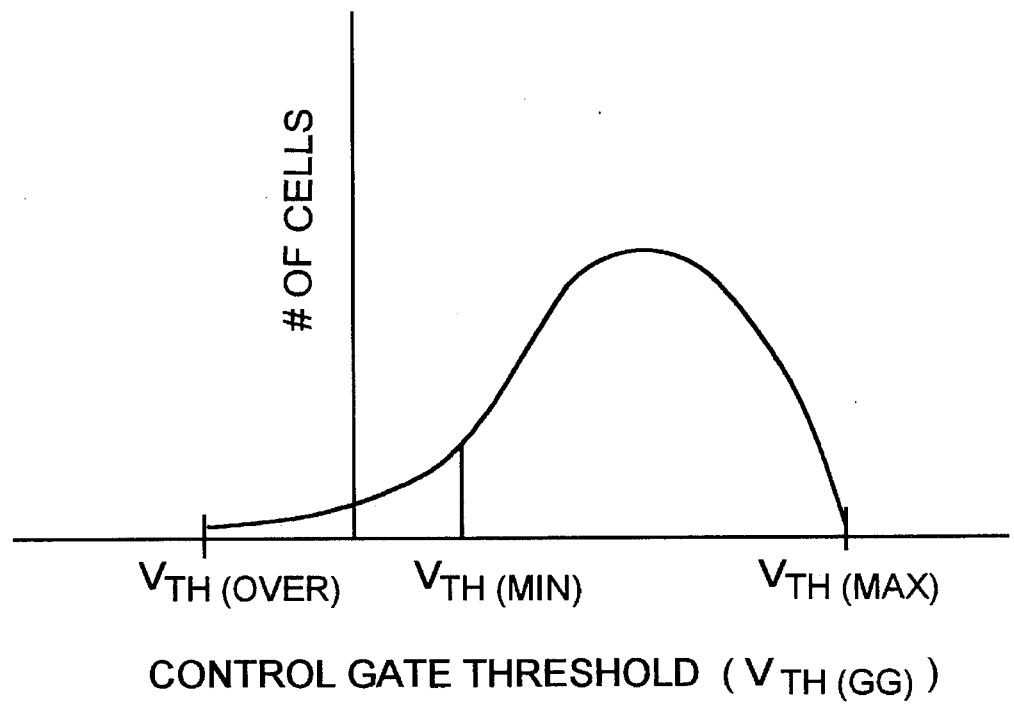
FIG. 1 is a turn-on threshold distribution curve of NMOS PROM single transistor memory cells measured upon the control gate after one or more program/erase cycles.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the drawings, FIG. 1 illustrates a turn-on threshold ($V_{th}$) distribution curve of an NMOS EPROM memory array after one or more program and erase operations are concluded. After cells have undergone one or more erase cycles, the cell thresholds undergo a skew effect. Namely, some cells may become over-erased and demonstrate a negative threshold shown in FIG. 1 as $V_{th(over)}$. A negative threshold associated with an over-erased transistor cell causes that cell to function as a depletion-mode transistor rather than an enhancement-mode transistor. The problems of over-erasure should be avoided by redistributing the distribution curve shown in FIG. 1 to a tighter curve. Preferred redistribution involves changing the threshold of cells which have been over-erased to positive threshold values, within a tolerable range. As such, it is desirable to tighten the distribution using a scheme described as drain avalanche hot carrier (DAHC) injection, and more preferably, using an improved DAHC injection methodology. DAHC injection of the floating gate moves the threshold voltages of all erased cells below the acceptable minimum threshold back within an acceptable minimum to maximum threshold range. A convergence operation is thereby used to move cell thresholds within the range of $V_{th(over)}$ to $V_{th(min)}$ back to the range between $V_{th(min)}$ to $V_{th(max)}$.

DAHC injection must periodically be performed upon a non-volatile memory array, such as a flash EPROM device. Optimal injection resulting in over-erase convergence implies a fast re-distribution of cell thresholds back to the acceptable range of $V_{th(min)}$ to $V_{th(max)}$. Fast convergence allows cell thresholds to be re-distributed within the time allotted between normal erase and program operations. Accordingly, convergence is performed within the normal operating cycle of a memory array. Preferably, convergence is carried out, as required, after program/erasure cycles have been completed and prior to the next program cycle. Convergence is performed by taking an over-erasure reading upon the array. Re-distribution of thresholds via convergence enhances the endurance of the memory cell.

Figure 2:
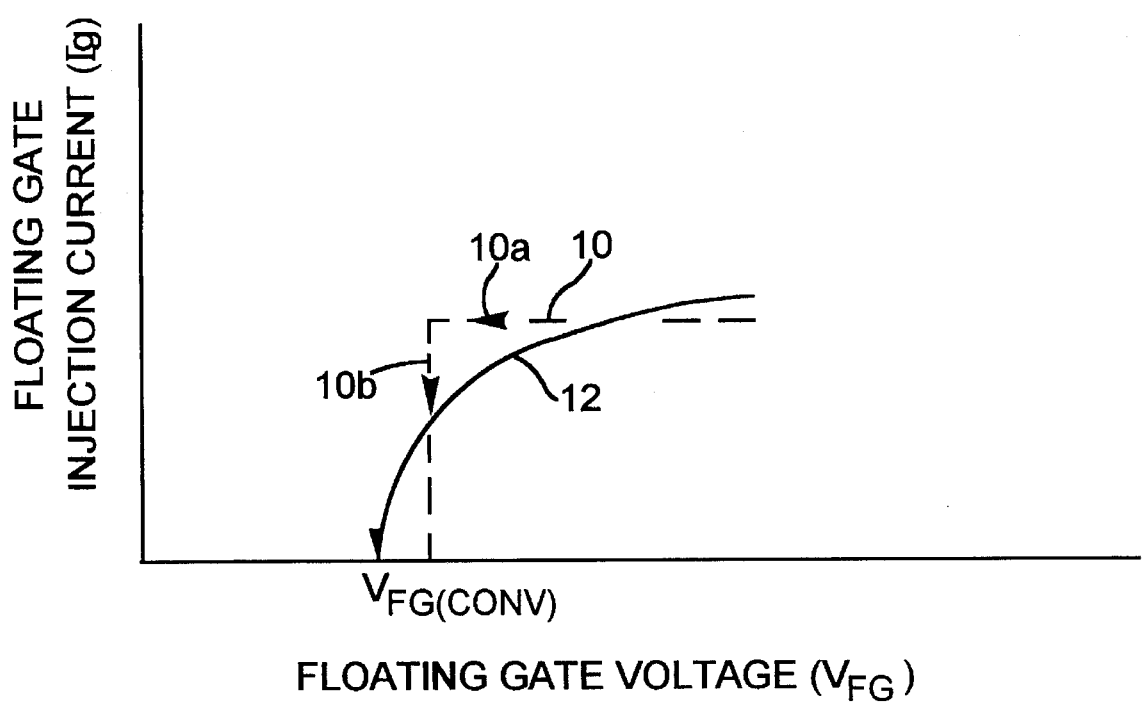
FIG. 2 is an over-erased correction curve of floating gate injection current measured as a function of floating gate voltage for ideal and non-ideal conditions.

FIG. 2 illustrates a convergence curve necessary to correct over-erased cells within a non-volatile memory array. An ideal curve 10 and a non-ideal curve 12 are shown. Ideal curve 10 is represented as a step-like function having horizontal portion 10a and vertical portion 10b. The arrows upon curve 10 indicate a floating gate injection current ($I_g$) at a relatively fixed value along portion 10a until sufficient carriers have been injected to cause convergence to a floating gate voltage designated as $V_{fg(conv.)}$. Once the floating gate voltage has achieved a convergence potential, injection current $I_g$ thereby steps downward from a fixed value along horizontal line 10a to a zero value, as shown by vertical line 10b.

Carriers injected into the floating gate as a result of $I_g$, increase the control gate threshold of transistors which have been over-erased toward the $V_{th(min)}$ amount. Once thresholds reach $V_{th(min)}$ corresponding to the floating gate convergence value $V_{fg(conv.)}$, the gate electron current drops abruptly and the thresholds of the over-erased cells are substantially frozen near $V_{th(min)}$. Accordingly, the thresholds of over-erased cells between $V_{th(over)}$ and $V_{th(min)}$ are converged back to $V_{th(min)}$. All of the transistors which are not over-erased (i.e., normal cells) are maintained within their acceptable threshold range of $V_{th(min)}$ and $V_{th(max)}$. The minimum convergence time $T_{conv.}$ for the operation described by ideal curvature 10 is described as follows:

$$T_{conv.} = C_g(V_{th(min)} - V_{th(over)})/I_{g(conv.)},$$

where $C_g$ is the inter-poly capacitance between the control gate and floating gates of a single cell flash transistor. $T_{conv.}$ can thereby be shortened by increasing $I_{g(conv.)}$. $I_{g(conv.)}$ is the convergence current described along the horizontal portion 10a of ideal curve 10.

Non-ideal curve 12 of FIG. 2 better represents the convergence operation of a practical flash transistor cell. Instead of a step-like function of curve 10, curve 12 indicates a more rounded feature, illustrated as having a minimum convergence time $T_{conv.}$ deduced as follows:

$$T_{conv.} = \int_{V_{th(over)}}^{V_{th(min)}} C_g/I_{g(conv.)}(V_{th})dV_{th}$$

The criteria for convergence is somewhat modified. Namely, the threshold voltages of all the over-erased cells between $V_{th(over)}$ and $V_{th(min)}$ are converged into the range between $V_{th(min)}$ to $V_{th(min)}+0.1$ volts. The voltage thresholds of all the normal cells are kept within the range of $V_{th(min)}$ and $V_{th(max)}$ after convergence has been completed. Re-distribution is therefore pertinent only to the over-erased cells, or cells having a threshold below $V_{th(min)}$.

Figure 3:
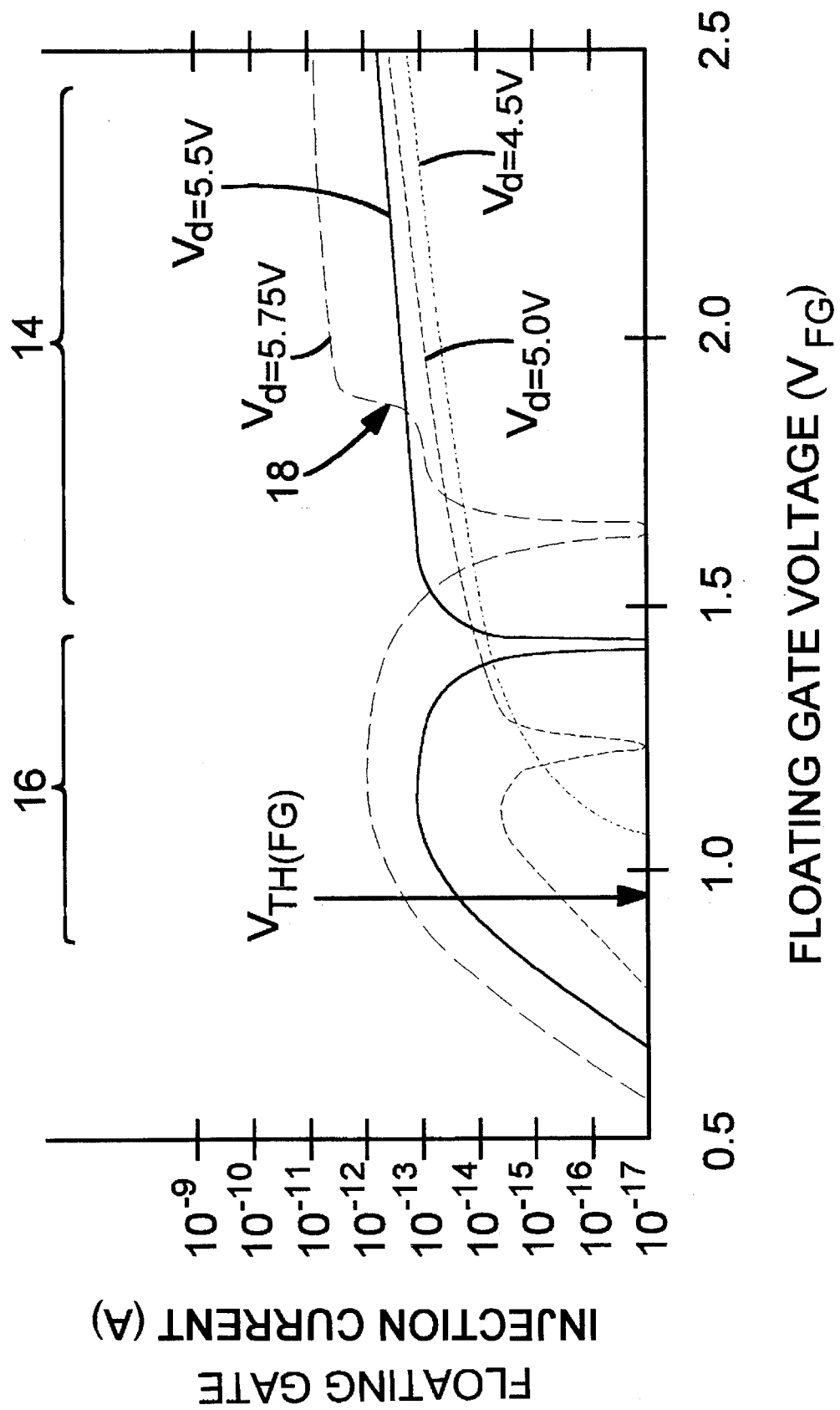
FIG. 3 is an over-erased correction curve of actual floating gate injection current measured with a grounded substrate as a function of floating gate voltage and drain voltage.

Actual measurements were performed on stacked gate flash NMOS EPROM cells, as represented in FIG. 3. The measurements were performed on single transistor flash EPROM cells having approximately 70 Angstrom tunnel oxide, 0.25 µm effective channel length, approximately $2 \times 10^{17}$ cm$^{-3}$ substrate doping, 0.2 µm junction depth and greater than 10 volt junction breakdown voltage. Measurements were performed on the representative device using DAHC injection methodology for various drain voltages ($V_d$). Drain voltages were changed for each test between 4.5 volts to 5.75 volts. The substrate and source regions were grounded. For floating gate injection ($I_g$) currents at floating gate voltages ($V_{fg}$) exceeding $V_{fg(conv.)}$, curves were obtained representing drain avalanche hot electron gate currents illustrated in region 14. Corresponding drain hot hole gate currents for $I_g$ at $V_{fg}$ less than $V_{fg(conv.)}$ are shown in region 16. Except for drain voltage of 4.5 volts, convergence between curves 14 and 16 are shown. Specifically, $V_{fg(conv.)}$ at a 5.0 volt drain appears at approximately 1.25 volts; convergence at a 5.5 volt drain appears at approximately 1.45 volts; and, convergence at a 5.75 volt drain appears at approximately 1.6 volts. In each case, convergence voltage $V_{fg(conv.)}$ exceeds the threshold voltage $V_{th(fg)}$, with substrate grounded. The convergence in the normal DAHC scheme is achieved by balancing hot hole injection against hot electron injection. Thus, normal cells with thresholds above $V_{th(min)}$ are being converged to $V_{th(min)}$. The result is that both over-erased cells and normal cells are turned on during the convergence operation. This causes large amounts of source-to-drain current and resulting high power consumption of an array of cells undergoing convergence. It is desirable to increase the drain voltage to achieve a higher injection current $I_g$ at the floating gate; however, increase in drain voltage worsens the power consumption problem.

As shown in FIG. 3, drain voltages of 5.75 volts achieve the highest floating gate injection current $I_g$ further compounding the power consumption problem. At sufficiently high drain voltages, a junction breakdown may result between the drain region and the substrate region causing what is often termed a "snap-back breakdown" shown by reference numeral 18. Snap-back breakdown results when drain voltages are extremely high, causing a current flow between the drain region and the substrate, often denoted as substrate current. Accordingly, high drain voltages cause power consumption in the form of source-to-drain current as well as substrate current. Still further, as drain voltages increase, hot electron gate current increase moderately while hot hole gate currents increase more rapidly, as shown in the disparity between respective curves in regions 14 and 16. It is therefore desirable to enhance the hot electron gate currents to levels greater than $1 \times 10^{-13}$ amperes but, in so doing, maintaining a drain voltage less than 5.0 volts or possibly less than 4.5 volts. A lower drain voltage results in a higher relative hot electron gate current compared to the hot hole gate current.

Figure 4:
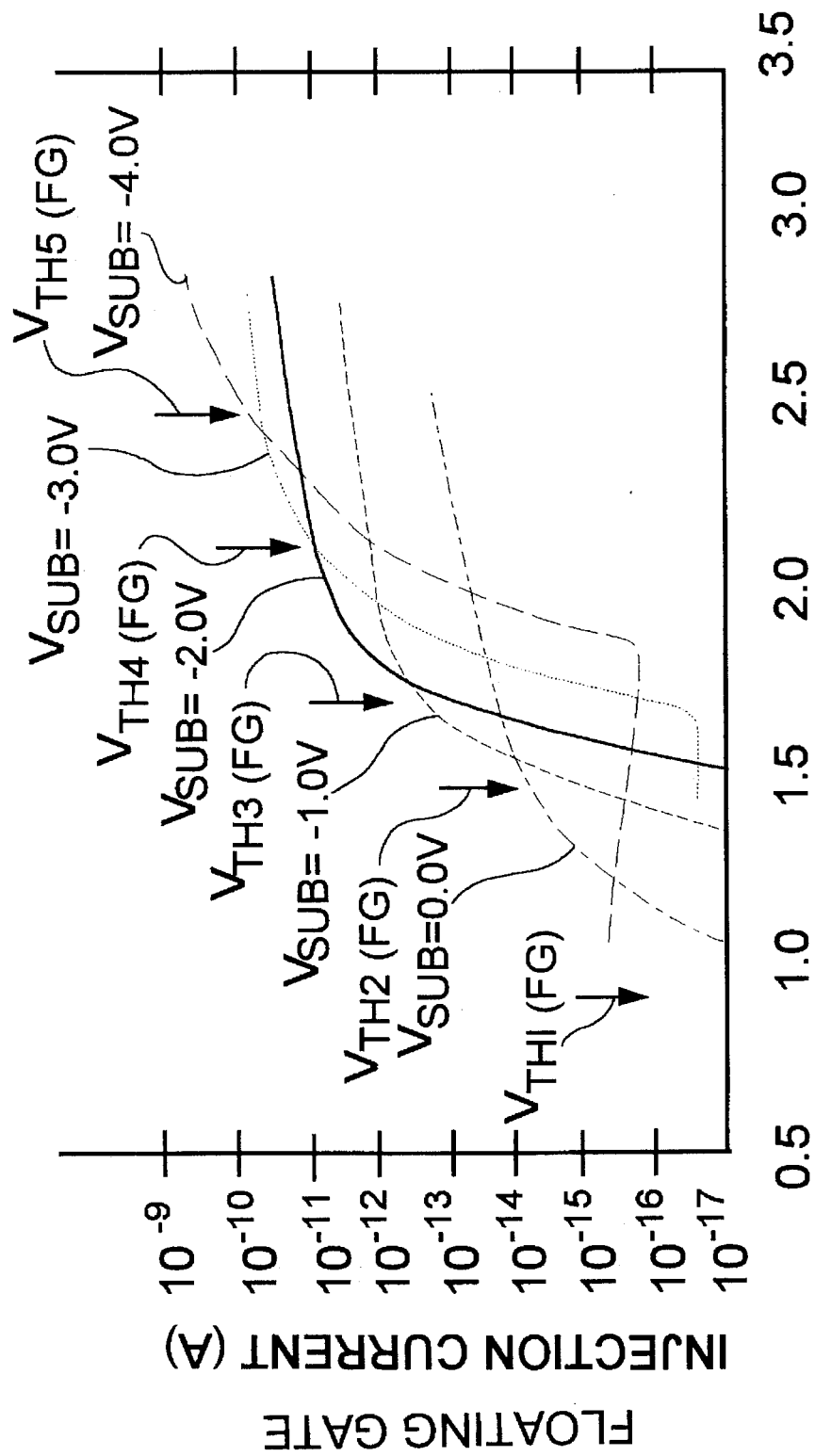
FIG. 4 is an over-erased correction curve of actual floating gate injection current measured with a lessened (e.g., 4.5 volt) drain voltage as a function of floating gate voltage and negative substrate voltage.

Turning now to FIG. 4, various over-erased correction curves are shown as measured. The correction curves are obtained using the referenced flash EPROM single transistor memory cell. Instead of grounding the substrate, however, the substrate is tied to various negative voltages, and the drain voltage is maintained at a relatively low positive level. Specifically, FIG. 4 illustrates substrate voltages ranging between zero volts and −4.0 volts and a drain voltage in each instance at 4.5 volts (i.e., less than the problematic 5.0–5.75 volt drains demonstrated in the curves of FIG. 3). By coupling the substrate to a negative voltage, a higher drain avalanche hot electron gate current $I_g$ can be achieved. A −4.0 volt substrate demonstrates the highest floating gate injection current, much higher than a grounded substrate of 0.0 volts. By maintaining the drain voltage at 4.5 volts, the various curves in FIGS. 4 lack associated drain hot hole gate currents. Specifically, each of the curves represent avalanche hot electron gate currents only. FIG. 4 thereby depicts a more desirable outcome than that of FIG. 3. Here currents drop to near zero once a threshold of $V_{th(min)}$ or greater has been achieved; thus, all the normal cells between $V_{th(min)}$ and $V_{th(max)}$ drain very little power during convergence. The advantages of maintaining lower power consumption using a lessened drain voltage while maintaining a higher floating gate injection current for shortest convergence time are but two reasons why a negative biased substrate is preferred over a grounded substrate. The substrate current is minimized by using a smaller drain current but further, the source-to-drain current is minimized as the substrate negative bias is increased. FIG. 4 depicts various floating gate thresholds ($V_{th1-5(fg)}$) at various substrate bias amounts. As the substrate bias increases in the negative direction, floating gate threshold also increases as shown in comparison between $V_{th1(fg)}$ and $V_{th5(fg)}$. Increase in threshold is to be expected as the substrate bias is increased in a negative direction. In each instance, however, the threshold voltage extends upward, and possibly beyond, the convergence voltage of the floating gate. All the normal cells have control gate thresholds greater than $V_{th(min)}$, and correspondingly floating gate voltages less than (to the left of) $V_{thx(fg)}$, where x is 1 to 5. Devices with floating gate voltage greater than $V_{th(fg)}$ will be on, however, these devices are the over-erased bits with net positive charge on the floating gate. Accordingly, by biasing the substrate more negative, the convergence operation of those negatively biased substrate devices is performed only with the over-erased cells turned on. All cells which are not over-erased are thereby maintained off during the convergence operation. Accordingly, the total source-drain current and power consumption is substantially reduced.

It is postulated that by lowering the positive drain voltage and raising the substrate negative bias, hole injection current is kept low by attracting the holes toward the substrate. Attraction of holes to the substrate helps minimize degradation of the floating gate and surrounding topological features resulting from hot holes injected therein. Application of a negative bias to the substrate achieves a more step-like function, similar to the ideal curve 10 shown in FIG. 2. The floating gate injection current $I_g$ convergence has been enhanced significantly by using a negative substrate bias. Such enhancement enables fast convergence operations but at smaller drain voltages.

Figure 5:
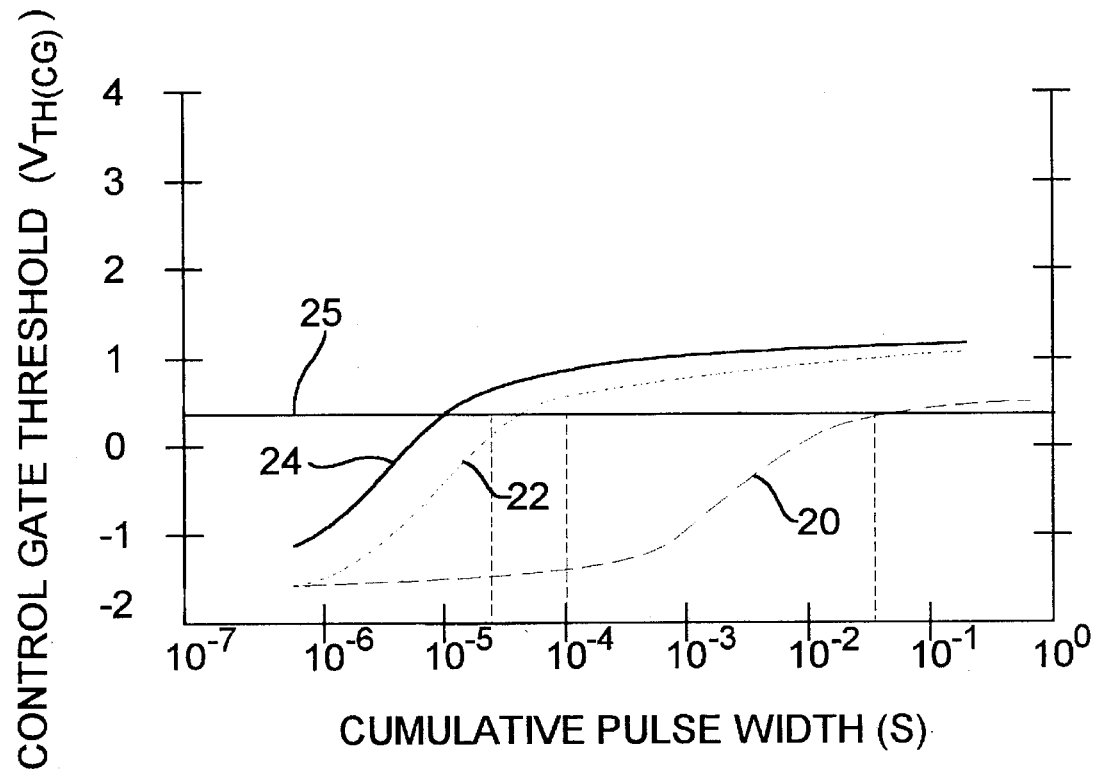
FIG. 5 is a graph of over-erased correction (convergence) time as a function of control gate threshold and substrate voltages.

Turning now to FIG. 5, the faster convergence is depicted in the graphical results, indicative of over-erase convergence time as a function of control gate threshold, substrate voltage and drain voltage. Curve 20 represents a single transistor flash EEPROM cell having a drain voltage set at 5.5 volts and a source voltage set at zero volts. Curve 22 represents the same device reconfigured with a drain voltage of 4.5 volts and a substrate voltage at −3.0 volts. Curve 24 also represents the same device but with a drain voltage of 4.5 volts and a substrate voltage of −4.0 volts. Curves 20 through 24 indicate a faster convergence of control gate threshold beyond line 25 at curvature 24 rather than curvature 20. Accordingly, by using a smaller drain voltage and a more negative substrate voltage, convergence time decreases from a value of more than ten millisecond to a value less than 100 microseconds. By simply changing the drain voltage from 5.5 volts to 4.5 volts and reducing the substrate voltage from ground to −3.0 volts, the curves of 20 versus 22 indicate at least 100 fold decrease in convergence time. A faster convergence time allows for faster correction of over-erased cells periodically performed between-read, write, program, etc. operations of a EPROM array.

Figure 6:
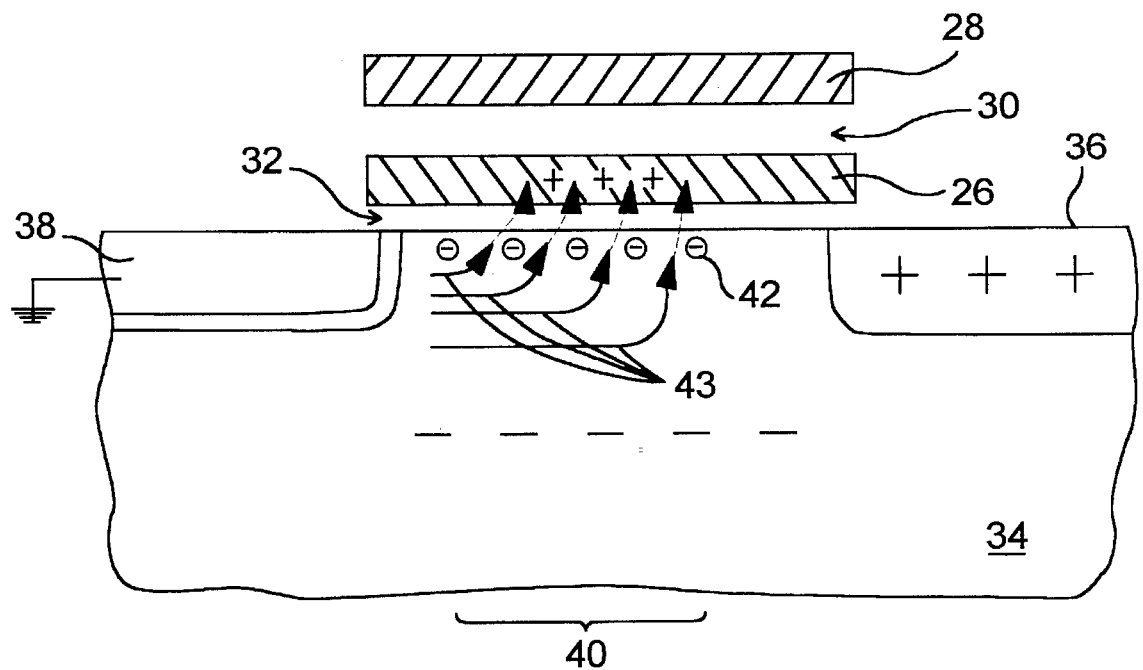
FIG. 6 is a partial cross-sectional view of a single transistor non-volatile memory cell having componentry biased to enhance convergence time with minimal drain voltage.

FIG. 6 indicates a partial cross-sectional view of a single transistor non-volatile memory cell. The memory cell is shown as a MOS PROM device with stacked floating gate 26 and control gate 28. Gates 26 and 28 are preferably made of a polysilicon material. An inter-poly dielectric 30 is formed between gates 26 and 28, and a thin dielectric 32 is formed between the upper surface of substrate 34 and the bottom surface of floating gate 26. Dielectric 32 can be made of an oxide material, and can include a tunnel oxide of relatively thin dimension. Formed within substrate 34 on opposing sides of stacked gates 26 and 28 is a drain region 36 and a double-diffused source region 38. According to a preferred embodiment, source region 38 is grounded and the drain region is biased positive. Drain region is biased preferably less than +5.0 volts, and in many instances less than +4.5 volts. A channel region 40 of substrate 34 resides between source and drain 38 and 36, respectively. Channel region 40 is biased with a negative voltage. Preferably substrate 34 and channel 40 are biased at a voltage between −0.5 volts and −4.0 volts. The control gate may be between 0.0 and 3.0 volts, as this affects the convergence level but not the convergence time.

Appropriately biased components of the single transistor device shown in FIG. 6 allows for sweeping of hot electrons 42 in an arcuate pattern 43 from grounded source to an over-erased, positively charged floating gate 26. Hot electrons 42 are injected upon floating gate 26 and comprise floating gate injection current $I_g$. Sufficient injection of hot electrons 42 substantially neutralizes positive charge upon the floating gate. Appropriate neutralization causes redistribution of the floating gate and control gate thresholds to a value between $V_{th(min)}$ and $V_{th(max)}$. A negatively biased substrate causes hot electrons 42 to repel from the substrate and onto floating gate 26. Sufficient negative bias on substrate 34 enhances the repulsion causing an increase in injection current.

An array of single transistor memory cells similar to that shown in FIG. 6, allows for bulk over-erase correction. In particular, the drains of each transistor within the array can be biased to a specific level, substantially less than normal operating levels of 5.0 volts, while the source and substrates are held at their respective ground and negative bias levels. Word lines may be at a voltage between 0.0 and 3.0 volts. The entire array drain, source and substrate are held at those values throughout the convergence operation. A transistor cell having a more positively charged (more over-erased) floating gate will receive a larger injection current than a transistor cell floating gate having a lesser positive charge. Convergence upon the entire array of transistors is thereby concluded at the same time, and at a faster rate using the negatively biased substrate connection. By utilizing a drain voltage less than 5.0 volts, power consumption during the convergence operation is substantially minimized.

It will be appreciated to those skilled in the art having the benefit of this disclosure that this invention is believed to be capable of applications with numerous types of non-volatile memory devices including EPROM, flash EPROM, and/or EEPROM devices in non-virtual ground or virtual ground configurations. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for correcting an over-erase condition within a non-volatile memory array, comprising:

providing a non-volatile memory array having a plurality of single transistor memory cells, each memory cell comprising a stacked pair of control and floating gates spaced above a channel region interposed between a source and drain region; and applying a non-negative voltage to the control gate, a ground voltage to the source region, a negative voltage to the channel region, and a positive voltage to the drain region.

2. The method as recited in claim 1, wherein said providing step comprises patterning the stacked pair of control and floating gates from a stacked pair of polysilicon layers having a dielectric layer interposed therebetween.

3. The method as recited in claim 1, wherein said providing step comprises implanting dopant ions into said source and drain regions after said stacked pair of control and floating gates are formed.

4. The method as recited in claim 1, wherein said dopant ions are twice implanted into said source region.

5. The method as recited in claim 1, wherein said channel region comprises a portion of a single crystalline substrate material, wherein said portion is adapted to receive a negative voltage.

6. The method as recited in claim 1, wherein said negative voltage is a voltage having an absolute magnitude greater than 0.5.

7. The method as recited in claim 1, wherein said negative voltage is a voltage having an absolute magnitude greater than 1.0.

8. The method as recited in claim 1, wherein said positive voltage is a voltage having an absolute magnitude less than 5.0.

9. The method as recited in claim 1, wherein said positive voltage is a voltage having an absolute magnitude less than 4.5.

10. The method as recited in claim 1, wherein said non-negative voltage is between 0.0 volts and 3.0 volts.

11. The method as recited in claim 1, as a result of said applying step, inducing electrons onto said floating gate for neutralizing positive charge thereon.

12. A method for neutralizing positive charge upon a plurality of floating gates connected within a memory array, comprising:

providing an array of transistors having a respective plurality of floating gates spaced from a single silicon substrate, said transistors are coupled between a common power supply and a plurality of bit lines; and connecting a positive voltage simultaneously to each of said plurality of bit lines, connecting a ground voltage to said common power supply, and connecting a negative voltage to said silicon substrate to cause neutralization of positive charge upon said plurality of floating gates.

13. The method as recited in claim 12, further comprising a control gate dielectrically spaced from said floating gate, wherein said control gate is electrically coupled to a non-negative voltage.

14. The method as recited in claim 12, wherein said connecting step comprises forming a current exceeding $1 \times 10^{-13}$ amperes through said floating gate at a floating gate voltage less than threshold turn-on voltage of the transistors.

15. The method as recited in claim 14, wherein said current is sufficient to move negative charge upon said floating gate to substantially neutralize the positive charge thereon.

16. The method as recited in claim 12, wherein said connecting step comprises forming a current exceeding $5 \times 10^{-13}$ amperes into said floating gate at a floating gate voltage less than threshold turn-on voltage of the transistors.

17. The method as recited in claim 16, wherein said current is sufficient to move negative charge upon said floating gate to substantially neutralize the positive charge thereon.

18. The method as recited in claim 12, wherein said positive voltage is less than 5.0 volts.

19. The method as recited in claim 12, wherein said neutralization of positive charge occurs at a variable rate simultaneously across all of said plurality of floating gates within said array of transistors.

20. The method as recited in claim 12, wherein said non-negative voltage is between 0.0 volts and 3.0 volts.

21. A single transistor memory cell, comprising:
- a floating gate conductor dielectrically spaced above a silicon substrate into which a drain and source region are formed;
- a control gate dielectrically spaced above said floating gate;
- an electric field extending in a curved path from said source to said floating gate upon application of positive voltage to said drain, negative voltage to said substrate, ground voltage to said source, and non-negative voltage to said control gate; and
- hot electrons carried along said field for injection into said floating gate, an amount of said hot electrons being injected is in proportion to an amount of positive charge upon said floating gate.

22. The memory cell as recited in claim 21, wherein movement of said hot electrons along said field incurs the formation of a floating gate injection current exceeding $1 \times 10^{-13}$ amperes at a floating gate voltage less than the floating gate threshold turn-on voltage of the single transistor memory cell.

23. The memory cell as recited in claim 21, wherein movement of said hot electrons along said field incurs the formation of a floating gate injection current exceeding $5 \times 10^{-13}$ amperes at a floating gate voltage less than the floating gate threshold turn-on voltage of the single transistor memory cell.

* * * * *